(12) United States Patent
Ikuta et al.

(10) Patent No.: US 8,847,203 B2
(45) Date of Patent: Sep. 30, 2014

(54) GROUP III NITRIDE EPITAXIAL LAMINATE SUBSTRATE

(75) Inventors: Tetsuya Ikuta, Tokyo (JP); Jo Shimizu, Tokyo (JP); Tomohiko Shibata, Tokyo (JP)

(73) Assignee: Dowa Electronics Materials Co, Ltd., Tokyo (JP)

( * ) Notice: Subject to any disclaimer, the term of this patent is extended or adjusted under 35 U.S.C. 154(b) by 0 days.

(21) Appl. No.: 13/502,847

(22) PCT Filed: Nov. 4, 2010

(86) PCT No.: PCT/JP2010/006504
§ 371 (c)(1),
(2), (4) Date: May 10, 2012

(87) PCT Pub. No.: WO2011/055543
PCT Pub. Date: May 12, 2011

(65) Prior Publication Data
US 2012/0223328 A1    Sep. 6, 2012

(30) Foreign Application Priority Data

Nov. 4, 2009  (JP) ................................. 2009-253009
Nov. 4, 2010  (JP) ................................. 2010-247432

(51) Int. Cl.
| | | |
|---|---|---|
| H01L 29/06 | (2006.01) | |
| H01L 29/15 | (2006.01) | |
| H01L 29/205 | (2006.01) | |
| H01L 21/02 | (2006.01) | |
| H01L 29/20 | (2006.01) | |

(52) U.S. Cl.
CPC .......... *H01L 29/2003* (2013.01); *H01L 29/155* (2013.01); *H01L 29/205* (2013.01); *H01L 21/0254* (2013.01); *H01L 21/02458* (2013.01); *H01L 21/02381* (2013.01); *H01L 21/02507* (2013.01)
USPC ............................................. 257/15; 257/194

(58) Field of Classification Search
CPC ........................... H01L 21/02507; H01L 29/15
USPC .................... 257/E29.091, 76, 194, E29.025, 257/E21.09; 438/167
See application file for complete search history.

(56) References Cited

U.S. PATENT DOCUMENTS 5,900,071 A * 5/1999 Harman .................... 136/236.1
6,479,836 B1 * 11/2002 Suzuki et al. .................. 257/15
(Continued)

FOREIGN PATENT DOCUMENTS

| CN | 1692499 A | 11/2005 |
|---|---|---|
| JP | A-2003-258005 | 9/2003 |

(Continued)

OTHER PUBLICATIONS

Sep. 24, 2013 Notice of Preliminary Rejection issued in Korean Patent Application No. 10-2012-7012387 (with English-language translation).

(Continued)

*Primary Examiner* — Jarrett Stark
*Assistant Examiner* — Shahed Ahmed
(74) *Attorney, Agent, or Firm* — Oliff PLC

(57) ABSTRACT

A Group III nitride epitaxial laminate substrate comprising a substrate, a buffer and a main laminate in this order, wherein the buffer includes an initial growth layer, a first superlattice laminate and a second superlattice laminate in this order, the first superlattice laminate includes five to 20 sets of first AlN layers and second GaN layers, the first AlN layers and the second GaN layers being alternately stacked, and each one set of the first AlN layer and the second GaN layer has a thickness of less than 44 nm, the second superlattice laminate includes a plurality of sets of first layers made of an AlN material or an AlGaN material and second layers made of an AlGaN material having a different band gap from the first layers, the first and second layers being alternately stacked.

7 Claims, 4 Drawing Sheets

(56) References Cited

U.S. PATENT DOCUMENTS

| | | | |
|---|---|---|---|
| 7,119,372 B2 * | 10/2006 | Stokes et al. | 257/79 |
| 8,426,893 B2 * | 4/2013 | Ikuta et al. | 257/194 |
| 2006/0068601 A1 | 3/2006 | Lee et al. | |
| 2006/0118824 A1 | 6/2006 | Otsuka et al. | |
| 2006/0154455 A1 * | 7/2006 | Guo et al. | 438/483 |
| 2007/0108456 A1 | 5/2007 | Wong et al. | |
| 2007/0111345 A1 | 5/2007 | Wong et al. | |
| 2008/0203382 A1 | 8/2008 | Yanagihara | |
| 2009/0053845 A1 | 2/2009 | Wong et al. | |
| 2009/0242874 A1 * | 10/2009 | Biwa et al. | 257/28 |

FOREIGN PATENT DOCUMENTS

| | | |
|---|---|---|
| JP | A-2007-067077 | 3/2007 |
| JP | A-2007-142397 | 6/2007 |
| JP | A-2010-251738 | 11/2010 |
| KR | 10-2005-0084774 A | 8/2005 |
| WO | WO 2005/015642 A1 | 2/2005 |

OTHER PUBLICATIONS

International Search Report issued in International Application No. PCT/JP2010/006504 dated Feb. 8, 2011.

Jun. 4, 2014 Office Action issued in Chinese Patent Application No. 201080060505.7 (with translation).

Apr. 8, 2014 Office Action issued in Japanese Patent Application No. 2010-247432 (with translation).

May 26, 2014 Supplementary Search Report issued in European Patent Application No. 10828104.9.

* cited by examiner

GROUP III NITRIDE EPITAXIAL LAMINATE SUBSTRATE

TECHNICAL FIELD

The present invention relates to a Group III nitride epitaxial laminate substrate, in particular to a Group III nitride epitaxial laminate substrate having good crystal quality with less substrate warpage.

RELATED ART

Recently, in general, Group III nitride semiconductors made of compounds of Al, Ga, In, etc. and N are widely used for light emitting elements, elements for electronic devices, and the like. The characteristics of such devices are greatly dependent on the crystallinity of Group III nitride semiconductors; therefore, techniques for growing highly crystalline Group III nitride semiconductors are needed.

Group III nitride semiconductors have been conventionally formed by epitaxial growth on sapphire substrates. However, sapphire substrates have poor heat dissipation due to low thermal conductivity, which is not suitable for making high power output devices.

Therefore, in recent years, techniques of using silicon substrates as substrates for crystal growth of Group III nitride semiconductors have been proposed. Silicon substrates have better heat dissipation than the above sapphire substrates, so that they are suitable for making high power output devices. Further, since large silicon substrates are inexpensive, they are advantageous in reducing production cost. However, as with sapphire substrates, silicon substrates have different lattice constants from Group III nitride semiconductors. Therefore, growing of a Group III nitride semiconductor directly on such a silicon substrate is not expected to provide a highly crystalline Group III nitride semiconductor.

Further, a Group III nitride semiconductor has a significantly high thermal expansion coefficient as compared with silicon. Accordingly, in a case where this Group III nitride semiconductor is grown directly on a silicon substrate, great tensile strain occurs in the Group III nitride semiconductor in the process of cooling from the high temperature of a crystal growth process to room temperature. This leads to problems of warpage of the Group III nitride epitaxial laminate substrate with the silicon substrate side being a convex side and generation of high-density of cracks therein.

Correspondingly, JP 2007-67077A (Patent Document 1) discloses a technique of producing a highly crystalline Group III nitride semiconductor, in which crack generation is prevented, by providing an AlN-based superlattice buffer layer between a silicon substrate and the Group III nitride semiconductor.

Here, JP 2007-67077A (Patent Document 1) refers to improvement in crystallinity and prevention of crack generation by smoothing the surface of a nitride semiconductor layer at the atomic level. However, there is no reference made to substrate warpage.

On the other hand, with respect to the thickness of such a buffer layer, the crystallinity of a Group III nitride semiconductor to be formed thereon can be improved as the thickness is larger, while substrate warpage tends to increase due to the difference of thermal expansion coefficient between the Group III nitride semiconductor and silicon. In other words, when the buffer layer is thick, the crystallinity can probably be enhanced, and on the contrary, in that case, more substrate warpage would occur.

PRIOR ART DOCUMENT

Patent Document

[Patent Document 1] JP2007-67077 A

DISCLOSURE OF THE INVENTION

Problems to be Solved by the Invention

In view of the above problems, an object of the present invention is to provide a Group III nitride epitaxial laminate substrate which can improve crystallinity of a Group III nitride semiconductor without increasing substrate warpage, in other words, which can achieve both improvement in crystallinity and suppression of substrate warpage.

Means for Solving the Problem

In order to achieve the above object, the present invention primarily includes the following components.

(1) A Group III nitride epitaxial laminate substrate includes a substrate, a buffer formed on the substrate, and a main laminate formed by epitaxially growing a Group III nitride layer on the buffer. The buffer includes an initial growth layer in contact with the substrate, a first superlattice laminate formed on the initial growth layer, and a second superlattice laminate formed on the first superlattice laminate. The first superlattice laminate includes five to 20 sets of first AlN layers made of an AlN material and second GaN layers made of a GaN material, the first AlN layers and the second GaN layers being alternately stacked, and each one set of the first AlN layer and the second GaN layer has a thickness of less than 44 nm. The second superlattice laminate includes a plurality of sets of first layers made of an AlN material or an AlGaN material and second layers made of an AlGaN material having a different band gap from the first layers, the first and second layers being alternately stacked.

(2) The Group III nitride epitaxial laminate substrate according to (1) above, wherein each one set of the first AlN layer and the second GaN layer in the first superlattice laminate has a thickness of 24 nm or less, and each of the first AlN layers has a thickness of 4 nm or less.

(3) The Group III nitride epitaxial laminate substrate according to (2) above, wherein each one set of the first AlN layer and the second GaN layer in the first superlattice laminate has a thickness of less than 10.5 nm, and each of the first AlN layers has a thickness of less than 4 nm.

(4) The Group III nitride epitaxial laminate substrate according to any one of (1) to (3) above, wherein the first layers in the second superlattice laminate are made of an AlN material, and the second layers are made of an $Al_xGa_yN$ (0<x<1, 0<y<1, x+y=1) material.

(5) The Group III nitride epitaxial laminate substrate according to any one of (1) to (4) above, wherein the number of sets of the first layers and the second layers in the second superlattice laminate is in the range of 40 to 300.

(6) The Group III nitride epitaxial laminate substrate according to any one of (1) to (5) above, wherein the buffer is electrically insulating, and a lateral direction is a current flow direction.

(7) The Group III nitride epitaxial laminate substrate according to any one of (1) to (6) above, wherein an average C concentration of the second superlattice laminate is $1 \times 10^{18}/cm^3$ or more.

(8) The Group III nitride epitaxial laminate substrate according to any one of (1) to (7) above, wherein the substrate is a Si single crystal substrate.

Effect of the Invention

In accordance with the present invention, a buffer includes a first superlattice laminate between an initial growth layer and a second superlattice laminate, so that the crystallinity of a Group III nitride layer grown on the buffer can be improved without increasing substrate warpage.

BEST MODE FOR CARRYING OUT THE INVENTION

Figure 1:
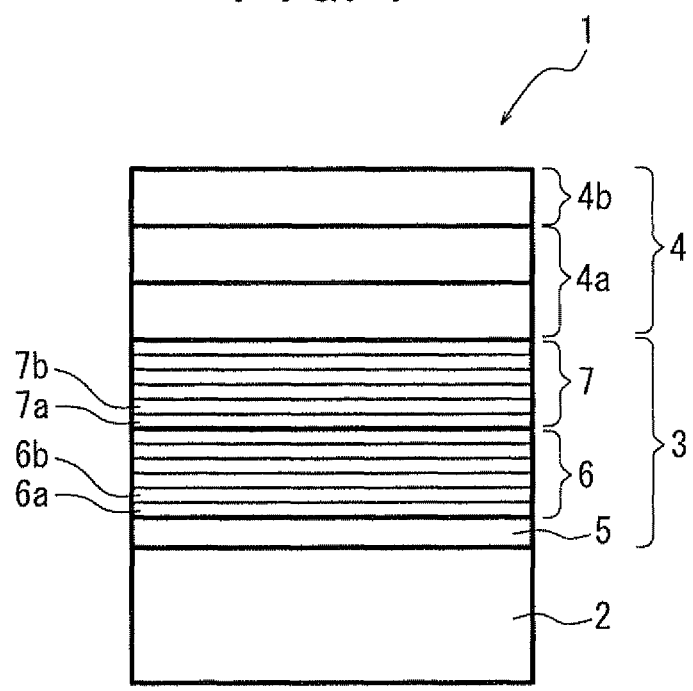
FIG. 1 is a schematic cross-sectional view of a Group III nitride epitaxial laminate substrate according to the present invention.

Next, embodiments of a Group III nitride epitaxial laminate substrate of the present invention will be described with reference to the drawings. FIG. 1 schematically shows a cross-section structure of a Group III nitride epitaxial laminate substrate for electronic devices in accordance with the present invention. Note that the epitaxial laminate substrate in FIG. 1 is enlarged in the thickness direction for the sake of explanation.

As shown in FIG. 1, a Group III nitride epitaxial laminate substrate 1 of the present invention includes a substrate 2, a buffer 3 formed on this substrate 2, a main laminate 4 formed by epitaxially growing a Group III nitride layer on the buffer 3. The buffer 3 includes an initial growth layer 5 in contact with the substrate 2, a first superlattice laminate 6 formed on this initial growth layer 5, and a second superlattice laminate 7 formed on this first superlattice laminate 6.

The first superlattice laminate 6 includes a plurality of sets of first AlN layers 6a made of an AlN material and second GaN layers 6b made of a GaN material, which are stacked alternately. Note that the AlN material and the GaN material herein are preferably AlN and GaN; alternatively, they may contain total 5% or less of another Group III element (B, Ga, or In for the AlN material and B, Al, or In for the GaN material). Further, they may contain a slight amount of impurities such as Si, H, O, C, B, Mg, As, or P.

The second superlattice laminate 7 includes a plurality of sets of first layers 7a made of an AlN material or an AlGaN material and second layers 7b made of an AlGaN material which has a different band gap from these first layers 7a, which are stacked alternately. Note that an "AlGaN material" herein is preferably AlGaN, but may contain total 5% or less of another Group III element (B or In). Further, it may contain a slight amount of impurities such as Si, H, O, C, Mg, As, or P.

One of characteristic features of the Group III nitride epitaxial laminate substrate of the present invention is to provide the first superlattice laminate under the second superlattice laminate as described above. Employing the buffer layer having such an unprecedented layer structure, the crystallinity of the Group III nitride layer to be grown on the buffer can be improved without increasing substrate warpage. In other words, with a conventional buffer layer structure, when the buffer layer thickness is large, the substrate warpage is inevitably increased correspondingly. With the above layer structure, substrate warpage can be suppressed than conventional.

Further, the first superlattice laminate preferably has the above structure also in terms of crystallinity. The GaN material forming the second GaN layers is high in lateral growth rate, and is highly effective in bending and annihilating dislocations. Further, the AlN material forming the first AlN layers can increase the strain in GaN, and can maximize the effect of the GaN material.

In addition, the AlN material or the AlGaN material (the first layer) which has a larger band gap and higher resistivity is also preferable in terms of increasing vertical breakdown voltage, which is combined with the AlGaN material (the second layer) in the second superlattice laminate as described above.

The crystallinity in the present invention is evaluated with a full width at half maximum (FMHW) of the x-ray rocking curve (ω scan) on the (10-12) plane of a GaN channel layer as described in Experimental Examples below. Further, the substrate warpage is evaluated with the difference between the amount of warpage and the initial amount of warpage of a Si single crystal substrate after the growth of all layers as described in Experimental Examples below. In the present invention, the full width at half maximum can be less than 1200 and the amount of warpage can be 50 μm or less, more preferably, the full width at half maximum can be 1150 or less and the amount of warpage can be 40 μm or less, still more preferably, the full width at half maximum can be 1100 or less and the amount of warpage can be 35 μm or less.

The substrate 2 is preferably a Si single crystal substrate. On this occasion, the crystal plane of the Si single crystal substrate is not limited in particular, and the (111), (100), (110) planes or the like can be used. In order to grow the (0001) plane of the Group III nitride, the (110), (111) planes are preferable. Further, in order to achieve good surface evenness after the growth, the (111) plane is preferably used. The off-angle is set at 1° or less as appropriate such that the single crystal growth is not impaired. Further, either p-type or n-type of conductivity may be used, and any value of resistivities of 0.001 Ω·cm to 100000 Ω·cm is applicable. The resistivity is not necessarily uniform in the whole Si single crystal substrate. Here, the Si substrate may contain impurities (C, O, N, Ge, etc.) added for the purpose of other than controlling electrical conductivity. Further, a "Si single crystal substrate" generally refers to a substrate having a single crystal substrate on the growth layer side, and includes such a substrate in which another substrate is attached or a film made of another material such as an oxide film or a nitride film is formed onto the side opposite to the growth layer. The thickness of the substrate is determined as appropriate considering the amount of warpage and the like after the single crystal growth.

Examples of typical materials for forming the initial growth layer 5 include $Al_xGa_{1-x}N$ ($0.9 \le x \le 1.0$). Further, when a portion of the initial growth layer 5 which approximates to the substrate is made of an AlN material, the reaction with the Si single crystal substrate can be suppressed to increase vertical breakdown voltage. Note that a thin film of nitride, oxide, carbide, or the like of Si, or a thin film obtained by reaction of AlN with such a film can be inserted at the interface portion between AlN and the Si single crystal substrate. Further, for the initial growth layer 5, for example, an amorphous layer or a polycrystalline layer such as a low temperature buffer layer can be formed with a thickness which does not impair crystal quality. Note that the initial growth layer 5 does not necessarily have a uniform composition in the thickness direction, and when a portion thereof approximating the substrate is made of an AlN material, the initial growth layer 5 may be a laminate of a plurality of layers having different compositions or its composition can be graded.

As a method for growing layers in the present invention, MOCVD or MBE which allows easy securing of steepness of surface is preferably used. In particular, effects of the present invention of improving crystal quality can be expected in the case of MOCVD. In the case of MOCVD, since the lateral growth rate is high as compared with the case of MBE, the probability of recombination and annihilation of dislocations in the first superlattice laminate is high, which allows the crystal quality to be further improved.

Each one set of the first AlN layer 6a and the second GaN layer 6b in the first superlattice laminate 6 has a thickness (the sum of the thicknesses of one first AlN layer 6a and one second GaN layer 6b) of less than 44 μm, preferably 24 nm or less, more preferably less than 10.5 nm. The thickness of each first AlN layer 6a is preferably 4 nm or less, more preferably less than 4 nm. When the thickness of one set of the first AlN layer 6a and the second GaN layer 6b or the thickness of one first AlN layer 6a exceeds the above thicknesses, the absolute value of the amount of warpage would increase. Note that the second superlattice laminate is preferably thicker than a predetermined thickness in terms of ensuring sufficient vertical breakdown voltage. Thus, the thickness of the first superlattice laminate is limited in the present invention as described above.

In the Group III nitride epitaxial laminate substrate 1 of the present invention, the number of sets of the first AlN layers 6a and the second GaN layers 6b in the first superlattice laminate 6 is in the range of five to 20. When the number of sets is more than 20, the warpage would increase; on the other hand, when the number of sets is less than 5, the effect of improving the crystal quality by inserting the laminate would not be achieved sufficiently.

Further, the first layers 7a of the second superlattice laminate 7 are preferably made of an AlN material, and the second layers 7b thereof are preferably made of an $Al_xGa_yN$ ($0<x<1$, $0<y<1$, $x+y=1$) material. This makes it possible to reduce the possibility of degradation in crystal quality due to possibility of generation of crystal structures other than a hexagonal system when the AlN or AlGaN material contains B. This also makes it possible to reduce the possibility of degradation in crystal quality due to In metal precipitation when the AlN or AlGaN material contains In. Further, in order to prevent cracks by the strain buffer effect of the superlattice laminate, the first layers 7a and the second layers 7b are required to have composition difference therebetween; therefore, $0.1 \leq x \leq 0.5$ is preferably satisfied. More preferably, $0.1 \leq x \leq 0.2$ is satisfied.

The number of sets of the first layers 7a and the second layers 7b in the second superlattice laminate 7 is preferably in the range of 40 to 300. When the number is more than 300, cracks would be generated. On the other hand, when the number is less than 40, the insulating property to be hereinafter described would not be ensured sufficiently.

Further, each of the layers forming the first and second superlattice laminates 6 and 7 of the buffer 3 (the first AlN layers 6a, the second GaN layers 6b, the first layers 7a, and the second layers 7b) preferably has a thickness of 0.5 nm or more. A thickness less than 0.5 nm corresponds to a thickness less than the thickness of a layer of one atom.

Moreover, it is preferable that the buffer 3 is electrically insulating, and a lateral direction is a current flow direction. Here, "a lateral direction is a current flow direction" refers to a state where, electric current flows, mainly in the width direction of the laminate. This state is different from, for example, the state where electric current flows mainly in the vertical direction, that is, the direction of the thickness of the laminate as in a structure in which a semiconductor is sandwiched between a pair of electrodes.

Note that an average C concentration of the second superlattice laminate 7 is preferably $1 \times 10^{18}/cm^3$ or more. The average C concentration of the second superlattice laminate 7 of $1 \times 10^{18}/cm^3$ or more improves vertical breakdown voltage, Further, in this case, in order to ensure the insulating property, and also to efficiently perform mixing of C, the Al composition ratio "x" of the second layers 7b is preferably more than 0.1. Further, when the insulating property is sufficiently ensured in the second superlattice laminate, the average C concentration of the first superlattice laminate is not limited in particular. In order to further improve the vertical breakdown voltage, the average C concentration of the first superlattice laminate is also preferably $1 \times 10^{18}/cm^3$ or more. Here, the "average C concentration" herein means the thickness-weighted average concentration of carbon inside the laminate in which the first layers 7a and the second layers 7b are alternately stacked, which is calculated based on the result of measuring the carbon concentration profile in the depth direction during film etching by SIMS.

The Group III nitride epitaxial laminate substrate 1 of the present invention can be used for any electronic devices, but particularly for HEMTs. The main laminate 4 shown in FIG. 1 may include a channel layer 4a made of a $B_{a1}Al_{b1}G_{c1}In_{d1}N$ ($0 \leq a1 \leq 1$, $0 \leq b1 \leq 1$, $0 \leq c1 \leq 1$, $0 \leq d1 \leq 1$, $a1+b1+c1+d1=1$) material and an electron supply layer 4b made of a $B_{a2}Al_{b2}Ga_{c2}In_{d2}N$ ($0 \leq a2 \leq 1$, $0 \leq b2 \leq 1$, $0 \leq c2 \leq 1$, $0d2 \leq 1$, $a2+b2+c2+d2=1$) material having a larger band gap than the channel layer 4a. On this occasion, either layer can be made of a single or a plurality of compositions. In particular, to prevent alloy scattering and to lower resistivity at the current flowing portion, at least a portion of the channel layer 4a which is in contact with the electron supply layer 4b is preferably made of a GaN material.

A portion of the channel layer 4a on the side opposite to the buffer layer preferably has a low C concentration, and the concentration is preferably set at $3 \times 10^{16}/cm^3$ or less. This is because since this portion corresponds to the current flowing portion of an electronic device, it is preferable that the portion does not contain impurities which hinder electrical conductivity or cause current collapse.

Note that FIG. 1 merely shows an example of a representative embodiment, and the present invention is not limited to the embodiments. For example, interlayers or another superlattice layer that would not adversely affect the effect of the present invention may be inserted between each layer, or the composition may be graded. Further, a nitride film, a carbide film, an Al layer, or the like can be formed on the surface of the substrate.

EXAMPLE

Example 1

Experimental Example 1

On a 3 inch (111) n-type Si single crystal substrate (Sb-doped, specific resistance: 0.015 Ω·cm, thickness: 600 μm), an initial growth layer in which AlN and $Al_{0.25}Ga_{0.75}N$ are sequentially stacked (AlN thickness: 100 nm, $Al_{0.25}Ga_{0.75}N$ thickness: 40 nm), a first superlattice laminate (20 sets of AlN/GaN, AlN thickness: 2 nm, GaN thickness: 6.5 nm), and a second superlattice laminate (100 sets of AlN/$Al_{0.15}Ga_{0.85}N$, AlN thickness: 4 nm, AlGaN thickness: 25 nm) were epitaxially grown as a buffer layer. On this second superlattice laminate, a GaN channel layer (thickness: 1.5 μm) and an $Al_{0.25}Ga_{0.75}N$ electron supply layer (thickness: 30 nm) were epitaxially grown as a main laminate to produce a Group III nitride epitaxial laminate substrate having a HEMT structure. As a growth method, MOCVD was used using TMA (trimethylaluminum), TMG (trimethylgallium), and ammonia as source materials. Nitrogen and hydrogen were used for a carrier gas. The Growth conditions of each layer (pressure, temperature) are as shown in Table 1.

TABLE 1

| Layer | Growth pressure (kPa) | Growth temperature (° C.) |
| --- | --- | --- |
| Initial growth layer | 10 | 1025 |
| First superlattice laminate | 10 | 1025 |
| Second superlattice laminate | 10 | 1025 |
| Channel layer on the Superlattice Side | 10 | 1025 |
| Channel layer on the Electron supply layer Side | 100 | 1075 |
| Electron supply layer | 10 | 1025 |

Experimental Example 2

A Group III nitride epitaxial laminate substrate having a HEMT structure was fabricated by a similar method to Experimental Example 1 except for that the above first superlattice laminate was not formed.

Experimental Example 3

On a 3 inch (111) n-type Si single crystal substrate (thickness: 600 μm), an initial growth layer made of an AlN material (thickness: 100 nm), a second superlattice laminate (50 sets of AlN/$Al_{0.15}Ga_{0.85}N$, AlN thickness: 4 nm, AlGaN thickness: 25 nm), a first superlattice laminate (20 sets of AlN/GaN, AlN thickness: 2 nm, GaN thickness: 6.5 nm), and a second superlattice laminate (50 sets of AlN/$Al_{0.15}Ga_{0.85}N$, AlN thickness: 4 nm, AlGaN thickness: 25 nm) were epitaxially grown as a buffer layer. On this second superlattice laminate, a GaN channel layer (thickness: 1.5 μm) and an $Al_{0.25}Ga_{0.75}N$ electron supply layer (thickness: 30 nm) were epitaxially grown as a main laminate to produce a Group III nitride epitaxial laminate substrate having a HEMT structure.

Experimental Example 4

On a 3 inch (111) n-type Si single crystal substrate (thickness: 600 μm), an initial growth layer made of an AlN material (thickness: 100 nm), a second superlattice laminate (100 sets of AlN/$Al_{0.15}Ga_{0.85}N$, AlN thickness: 4 mm, AlGaN thickness: 25 nm), and a first superlattice laminate (20 sets of AlN/GaN, AlN thickness: 2 nm, GaN thickness: 6.5 nm) were epitaxially grown as a buffer layer. On this first superlattice laminate, a GaN channel layer (thickness: 1.5 μm) and an $Al_{0.25}Ga_{0.75}N$ electron supply layer (thickness: 30 nm) were epitaxially grown as a main laminate to produce a Group III nitride epitaxial laminate substrate having a HEMT structure.

Experimental Example 5

On a 3 inch (111) n-type Si single crystal substrate (thickness: 600 μm), an initial growth layer made of an AlN material (thickness: 100 nm), a first superlattice laminate (10 sets of AlN/GaN, AlN thickness: 2 nm, GaN thickness: 6.5 nm), a second superlattice laminate (100 sets of AlN/$Al_{0.15}Ga_{0.85}N$, AlN thickness: 4 nm, AlGaN thickness: 25 nm), and a first superlattice laminate (10 sets of AlN/GaN, AlN thickness: 2 nm, GaN thickness: 6.5 nm) were epitaxially grown as a buffer layer. On this first superlattice laminate, a GaN channel layer (thickness: 1.5 μm) and an $Al_{0.25}Ga_{0.75}N$ electron supply layer (thickness: 30 nm) were epitaxially grown as a main laminate to produce a Group III nitride epitaxial laminate substrate having a HEMT structure.

Experimental Example 6

A Group III nitride epitaxial laminate substrate having a HEMT structure was fabricated by a similar method to Experimental Example 1 except for that AlN of the above first superlattice laminate had a thickness of 4 nm.

Experimental Example 7

A Group III nitride epitaxial laminate substrate having a HEMT structure was fabricated by a similar method to Experimental Example 1 except for that AlN of the above first superlattice laminate had a thickness of 4 nm and GaN thereof had a thickness of 20 nm.

Experimental Example 8

A Group III nitride epitaxial laminate substrate having a HEMT structure was fabricated by a similar method to Experimental Example 1 except for that AlN of the above first superlattice laminate had a thickness of 4 nm and GaN thereof had a thickness of 40 nm.

Experimental Example 9

A Group III nitride epitaxial laminate substrate having a HEMT structure was fabricated by a similar method to Experimental Example 1 except for that AlN of the above first superlattice laminate had a thickness of 6 nm and GaN thereof had a thickness of 40 nm.

Experimental Example 10

A Group III nitride epitaxial laminate substrate having a HEMT structure was fabricated by a similar method to Experimental Example 1 except for that the number of sets of AlN/GaN in the first superlattice laminate was five.

Experimental Example 11

A Group III nitride epitaxial laminate substrate having a HEMT structure was fabricated by a similar method to Experimental Example 1 except for that the number of sets of AlN/GaN in the first superlattice laminate was 40.

Experimental Example 12

A Group III nitride epitaxial laminate substrate having a HEMT structure was fabricated by a similar method to Experimental Example 1 except for that the number of sets of AlN/GaN in the first superlattice laminate was 100.

Evaluation

An x-ray rocking curve (ω scan) measurement was performed on the (0002) plane and the (10-12) plane of the GaN channel layer using an x-ray diffractometer (D8, manufactured by Bruker) with respect to Experimental Examples 1 to 12. The full width at half maximum (FMHW) of an x-ray rocking curve on the (10-12) plane is a criteria for evaluating the crystallinity of a Group III nitride layer.

The evaluation of the crystallinity is as follows.
++: 1100 or less
+: 1200-1100
−: 1200 or more Further, with respect to Experimental Examples 1 to 12, the amount of warpage of the Si single crystal substrate after growth of all layers was measured using a warpage measurement system using optical interferometry, and the difference between the measured value and the initial amount of warpage was calculated for the evaluation.

The results are shown in Table 2.

Note that cracks were not observed with respect to any of Experimental Examples.

buffer can be achieved only in cases where the buffer layer has a layer structure in which, on a substrate, an initial growth layer, a first superlattice laminate, and a second superlattice laminate are sequentially formed in that order. Therefore, sufficient crystallinity cannot be achieved not only in cases where no first superlattice laminate is provided (Experimental Example 2) but also in cases where the order of the lamination of the first and second superlattice laminates is opposite (Experimental Example 4) and cases where another superlattice laminate is added to the structure of the present invention (Experimental Examples 3 and 5).

Evaluation 2

Figure 3:
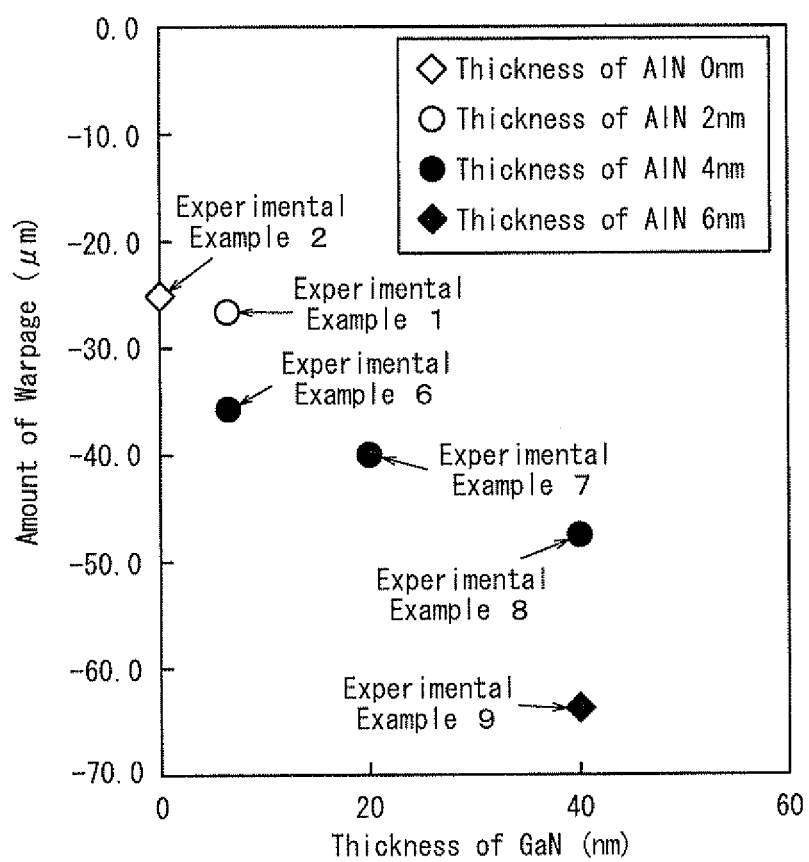
FIG. 3 is a graph showing plots of the results of measuring the amount of warpage in a Si single crystal substrate with the horizontal axis representing the thickness of a second GaN layer of a first superlattice laminate and with the vertical axis representing the difference between the measured amount of warpage and the initial amount of warpage with respect to Experimental Examples 1, 2, and 6 to 9.

FIG. 3 shows plots of the results of Experimental Examples 1, 2, and 6 to 9.

As shown in Table 2, the crystallinity of the (10-12) plane is favorable in Experimental Examples 6 and 7 as compared with that in Experimental Example 2. Further, FIG. 3 illustrates that the thickness of the first superlattice laminate in Experimental Examples 8 and 9 is larger than that in Experimental Examples 6 and 7, so that the warpage cannot be sufficiently suppressed. In other words, when the thickness of AlN in a first superlattice laminate is smaller, the amount of warpage of a Si single crystal substrate is found to be smaller.

Evaluation 3

As shown in Table 2, the crystallinity of the (10-12) plane is favorable in Experimental Examples 10 to 12 as compared with Experimental Example 2. Therefore, the improvement in the crystallinity in accordance with the present invention can

TABLE 2

| | First superlattice laminate | | | | Second superlattice laminate | | | Crystallinity | | |
| --- | --- | --- | --- | --- | --- | --- | --- | --- | --- | --- |
| | AlN thickness (nm) | GaN thickness (nm) | Sets | Total thickness (μm) | Sets | Total thickness (μm) | Warpage (μm) | FWHM (10-12) | Evaluation | |
| Experimental Example 1 | 2 | 6.5 | 20 | 0.17 | 100 | 2.9 | −26 | 998 | ++ | Example |
| Experimental Example 2 | | | | | 100 | 2.9 | −25 | 1221 | − | Comparative Example |
| Experimental Example 3 | 2 | 6.5 | 20 | 0.17 | 50/50 | 2.9 | −36 | 1238 | − | Comparative Example |
| Experimental Example 4 | 2 | 6.5 | 20 | 0.17 | 100 | 2.9 | −32 | 1683 | − | Comparative Example |
| Experimental Example 5 | 2 | 6.5 | 10/10 | 0.17 | 100 | 2.9 | −48 | 1840 | − | Comparative Example |
| Experimental Example 6 | 4 | 6.5 | 20 | 0.21 | 100 | 2.9 | −35 | 1091 | ++ | Example |
| Experimental Example 7 | 4 | 20 | 20 | 0.48 | 100 | 2.9 | −40 | 988 | ++ | Example |
| Experimental Example 8 | 4 | 40 | 20 | 0.88 | 100 | 2.9 | −47 | 1321 | − | Comparative Example |
| Experimental Example 9 | 6 | 40 | 20 | 0.92 | 100 | 2.9 | −63 | 1751 | − | Comparative Example |
| Experimental Example 10 | 2 | 6.5 | 5 | 0.043 | 100 | 2.9 | −25 | 1141 | + | Example |
| Experimental Example 11 | 2 | 6.5 | 40 | 0.34 | 100 | 2.9 | −60 | 905 | ++ | Comparative Example |
| Experimental Example 12 | 2 | 6.5 | 100 | 0.85 | 100 | 2.9 | −120 | 810 | ++ | Comparative Example |

Evaluation 1

Figure 2:
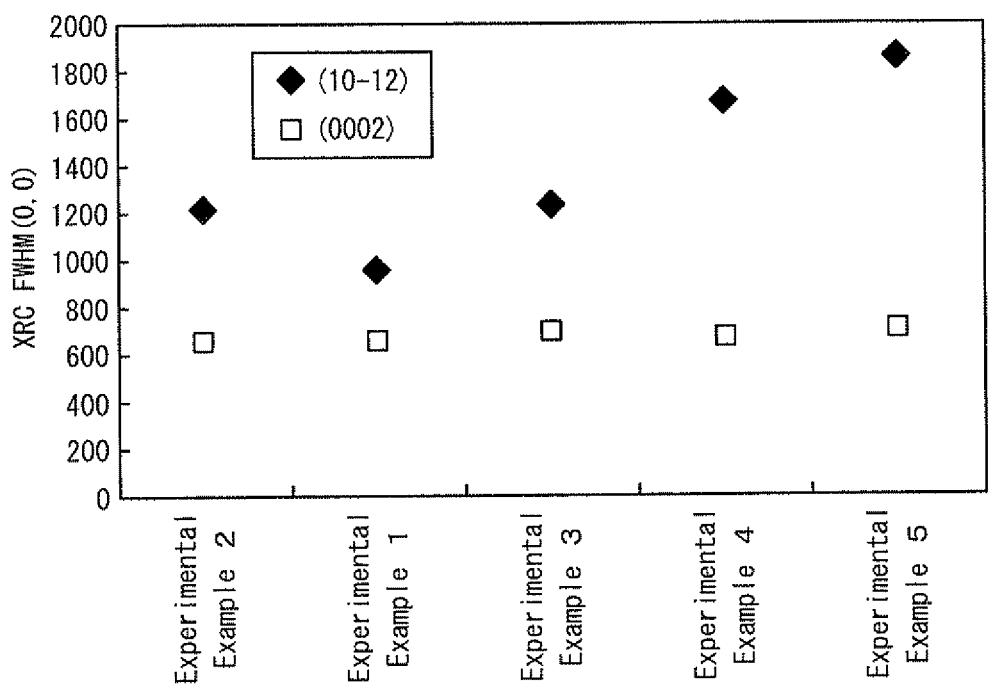
FIG. 2 is a graph showing plots of the results of measuring an x-ray rocking curve (ω scan) on the (0002) plane and the (10-12) plane of a GaN channel layer with respect to Experimental Examples 1 to 5.

FIG. 2 shows plots of the results of Experimental Examples 1 to 5. FIG. 2 demonstrates that the crystallinity of the (10-12) plane in Experimental Example 1 is better than that in Experimental Examples 2 to 5. This proves that the effect of improving the crystallinity of Group III nitride layers formed on the be achieved when the first superlattice laminate has five or more pairs (sets). On the other hand, the number of sets in the first superlattice laminate is large in Experimental Examples 11 and 12, so that substrate warpage cannot be sufficiently suppressed. Accordingly, it is proven that a smaller number of sets in the first superlattice laminate decreases the amount of warpage of a Si single crystal substrate.

Evaluation 4

Further, with respect to the Group III nitride epitaxial laminate substrate in Experimental Examples 1 and 2, the electrical characteristics of the channel portion was evaluated by the Hall effect measurement; the sheet resistance at the wafer center was 410 Ω/square, and the mobility was 1480 cm$^2$/Vs.

Evaluation 5

Further, with respect each epitaxial laminate substrate of all the experimental examples, the C concentrations of the first superlattice laminate, the second superlattice laminate, a portion of the GaN channel layer on the superlattice laminate side, and a portion of the GaN channel layer on the electron supply layer side were evaluated by SIMS (secondary ion mass spectrometer) to be $8\times10^{18}$/cm$^3$, $8\times10^{18}$/cm$^3$, $1\times10^{19}$/cm$^3$, and $2\times10^{16}$/cm$^3$, respectively to prove that the vertical breakdown voltage was 700 V or more.

Example 2

Figure 4:
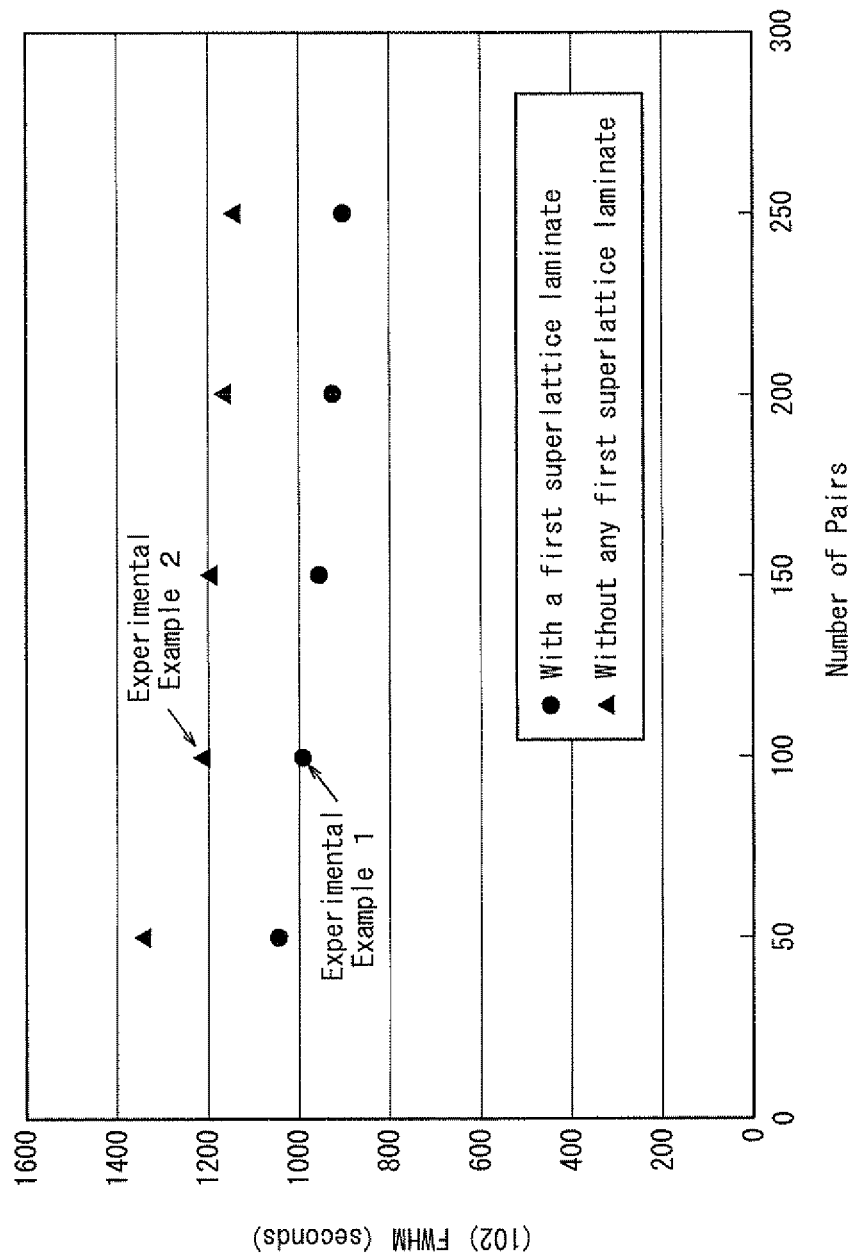
FIG. 4 is a graph showing the change in the full width at half maximum while the number of sets in a second superlattice laminate is changed, with respect to Experimental Examples 1 and 2.

FIG. 4 shows the results of evaluating the crystallinity of the (10-12) plane in a similar manner to Experimental Example 1 (with a first superlattice laminate) and Experimental Example 2 (without any first superlattice laminate) expect for that the number of sets in the second superlattice laminate was changed from Experimental Examples 1 and 2. The full width at half maximum tended to decrease when the number of pairs (sets) in the second superlattice laminate was increased with or without any first superlattice laminate. Meanwhile, any number of pairs in the second superlattice laminate results in smaller full width at half maximum with any first superlattice laminate than without any first superlattice laminate. Further, when the number of sets in the second superlattice laminate was changed from that in Experimental Example 1 (with a first superlattice laminate) (black circle in FIG. 4), the amount of warpage was reduced to a range of ±5 μm from the amount of warpage in Experimental Example 1 (26 μm). Meanwhile, when the number of sets in the second superlattice laminate was changed from that in the Experimental Example 2 (without any first superlattice laminate) (black triangle in FIG. 4), the amount of warpage exceeded the amount of warpage in Experimental Example 2 (25 μm) by 5 μm.

Example 3

The crystallinity of the (10-12) plane was evaluated in a similar manner to Experimental Example 1 except for that the Al composition of the second superlattice laminate was changed. The second superlattice laminate of AlN/Al$_{0.05}$Ga$_{0.95}$N (x=0.05) resulted in a favorable value of full width at half maximum (10-12) and a favorable amount of warpage as well as in Experimental Example 1, the full width at half maximum (10-12) being an evaluation criteria of the crystallinity; however, some cracks were generated on the semiconductor layer surface. The second superlattice laminate of AlN/Al$_{0.2}$Ga$_{0.8}$N (x=0.2) resulted in a favorable value of full width at half maximum (10-12) and a favorable amount of warpage as well as in Experimental Example 1, the full width at half maximum (10-12) being an evaluation criteria of the crystallinity, and no cracks were generated on the semiconductor layer surface.

INDUSTRIAL APPLICABILITY

According to the present invention, a buffer includes a first superlattice laminate between an initial growth layer and a second superlattice laminate, so that the crystallinity of a Group III nitride layer to be formed on the buffer can be improved without increasing substrate warpage.

EXPLANATION OF REFERENCE NUMERALS

1: Group III Nitride Epitaxial Laminate Substrate
2: Substrate
3: Buffer
4: Main Laminate
4a: Channel Layer
4b: Electron Supply Layer
5: Initial Growth Layer
6: First Superlattice Laminate
6a: First AlN Layer
6b: Second GaN Layer
7: Second Superlattice Laminate
7a: First Layer
7b: Second Layer

The invention claimed is:

1. A Group III nitride epitaxial laminate substrate comprising:
   a substrate;
   a buffer formed on the substrate; and
   a main laminate formed by epitaxially growing a Group III nitride layer on the buffer,
   wherein the buffer includes an initial growth layer in contact with the substrate, a first superlattice laminate formed on the initial growth layer, and a second superlattice laminate formed on the first superlattice laminate,
   the first superlattice laminate includes five to 20 sets of first AlN layers made of an AlN material and second GaN layers made of a GaN material, the first AlN layers and the second GaN layers being alternately stacked, and each one set of the first AlN layer and the second GaN layer has a thickness of less than 44 nm,
   the second superlattice laminate includes a plurality of sets of first layers made of an AlN material or an AlGaN material and second layers made of an AlGaN material having a different band gap from the first layers, the first and second layers being alternately stacked,
   the buffer is electrically insulating and electron conduction does not occur in the buffer, and
   an average C concentration of the second superlattice laminate is $1\times10^{18}$/cm$^3$ or more.

2. The Group III nitride epitaxial laminate substrate according to claim 1, wherein each one set of the first AlN layer and the second GaN layer in the first superlattice laminate has a thickness of 24 nm or less, and each of the first AlN layers has a thickness of 4 nm or less.

3. The Group III nitride epitaxial laminate substrate according to claim 2, wherein each one set of the first AlN layer and the second GaN layer in the first superlattice laminate has a thickness of less than 10.5 nm, and each of the first AlN layers has a thickness of less than 4 nm.

4. The Group III nitride epitaxial laminate substrate according to claim 1, wherein the first layers in the second superlattice laminate are made of an AlN material, and the second layers are made of an AlxGayN (0<x<1, 0<y<1, x+y=1) material.

5. The Group III nitride epitaxial laminate substrate according to claim 1, wherein the number of sets of the first layers and the second layers in the second superlattice laminate is in the range of 40 to 300.

6. The Group III nitride epitaxial laminate substrate according to claim 1, wherein a direction of current flow is in a lateral direction.

7. The Group III nitride epitaxial laminate substrate according to claim 1, wherein the substrate is a Si single crystal substrate.

* * * * *